US009680058B2

United States Patent
Kishino et al.

(10) Patent No.: US 9,680,058 B2
(45) Date of Patent: Jun. 13, 2017

(54) GROUP-III NITRIDE STRUCTURE INCLUDING A FINE WALL-SHAPED STRUCTURE CONTAINING A GROUP-III NITRIDESEMICONDUCTOR CRYSTAL AND METHOD FOR PRODUCING A GROUP-III NITRIDE STRUCTURE INCLUDING A FINE WALL-SHAPED STRUCTURE CONTAINING A GROUP-III NITRIDE SEMICONDUCTOR CRYSTAL

(75) Inventors: Katsumi Kishino, Tokyo (JP); Akihiko Kikuchi, Tokyo (JP)

(73) Assignee: SOPHIA SCHOOL CORPORATION, Tokyo (JP)

( * ) Notice: Subject to any disclaimer, the term of this patent is extended or adjusted under 35 U.S.C. 154(b) by 157 days.

(21) Appl. No.: 12/744,648

(22) PCT Filed: Nov. 26, 2008

(86) PCT No.: PCT/JP2008/003471
§ 371 (c)(1),
(2), (4) Date: Jun. 18, 2010

(87) PCT Pub. No.: WO2009/069286
PCT Pub. Date: Jun. 4, 2009

(65) Prior Publication Data
US 2010/0252836 A1    Oct. 7, 2010

(30) Foreign Application Priority Data
Nov. 27, 2007 (JP) .................................. 2007-306654

(51) Int. Cl.
*H01L 33/00* (2010.01)
*H01L 33/16* (2010.01)
(Continued)

(52) U.S. Cl.
CPC ............ *H01L 33/16* (2013.01); *C23C 14/042* (2013.01); *C30B 23/00* (2013.01); *C30B 29/403* (2013.01);
(Continued)

(58) Field of Classification Search
CPC ..... C30B 29/403; C30B 29/60; C30C 14/042; H01L 21/0259; H01L 21/02642;
(Continued)

(56) References Cited

U.S. PATENT DOCUMENTS 5,362,673 A * 11/1994 Iechi .................... H01L 27/153
148/DIG. 99
5,374,564 A * 12/1994 Bruel ........................... 438/455
(Continued)

FOREIGN PATENT DOCUMENTS

JP         11-330610 A      11/1999
JP      2004-2601152 A       9/2004
(Continued)

OTHER PUBLICATIONS

Klshino et al., "Selective-area growth of GaN nanocolumns on titanium-mask-patterned silicon (111) substrates by RF-plasma-assisted molecular-beam epitaxy", Electronics Letters 44 (2008) pp. 819-822.*
(Continued)

*Primary Examiner* — Jay C Kim
(74) *Attorney, Agent, or Firm* — Sughrue Mion, PLLC

(57) ABSTRACT

A group-III nitride structure includes a substrate 102 and a fine wall-shaped structure 110 disposed to stand on the substrate 102 in a vertical direction relative to a surface of the substrate 102 and extending in an in-plane direction of the substrate 102. The fine wall-shaped structure 110 contains a group-III nitride semiconductor crystal, and h is larger than d assuming that the height of the fine wall-shaped
(Continued)

structure 110 is h and the width of the fine wall-shaped structure 110 in a direction perpendicular to the height direction and the extending direction is d.

5 Claims, 9 Drawing Sheets

(51) Int. Cl.

| | | |
|---|---|---|
| C23C 14/04 | (2006.01) | |
| C30B 23/00 | (2006.01) | |
| C30B 29/40 | (2006.01) | |
| H01L 21/02 | (2006.01) | |
| H01L 29/04 | (2006.01) | |
| H01L 29/06 | (2006.01) | |
| H01L 29/20 | (2006.01) | |
| H01L 29/205 | (2006.01) | |
| H01L 33/20 | (2010.01) | |
| C30B 29/60 | (2006.01) | |
| H01L 29/66 | (2006.01) | |

(52) U.S. Cl.
CPC ........ *C30B 29/605* (2013.01); *H01L 21/0254* (2013.01); *H01L 21/0259* (2013.01); *H01L 21/02389* (2013.01); *H01L 21/02642* (2013.01); *H01L 29/045* (2013.01); *H01L 29/0657* (2013.01); *H01L 29/2003* (2013.01); *H01L 29/205* (2013.01); *H01L 33/20* (2013.01); *H01L 29/66795* (2013.01); *H01L 33/0075* (2013.01)

(58) Field of Classification Search
CPC ... H01L 29/045; H01L 29/06; H01L 29/0657; H01L 29/2003; H01L 33/0075; H01L 33/16; H01L 33/20
USPC ........................ 257/88, 94, 96, 97, 103, 615
See application file for complete search history.

(56) References Cited

U.S. PATENT DOCUMENTS

| | | | | |
|---|---|---|---|---|
| 6,426,512 | B1* | 7/2002 | Ito | H01L 33/0075 257/103 |
| 6,444,998 | B1* | 9/2002 | Taniguchi | H01L 27/153 257/13 |
| 6,586,778 | B2* | 7/2003 | Linthicum et al. | 257/103 |
| 6,630,366 | B2* | 10/2003 | Taniguchi | H01L 27/153 257/E27.121 |
| 6,979,584 | B2* | 12/2005 | Koike | B82Y 20/00 257/E21.108 |
| 6,995,406 | B2* | 2/2006 | Tojo | B82Y 20/00 257/102 |
| 7,135,348 | B2* | 11/2006 | Okuyama | H01L 33/24 257/190 |
| 7,522,649 | B2* | 4/2009 | Ha | H01S 5/4031 372/50.12 |
| 7,799,592 | B2* | 9/2010 | Lochtefeld | 438/44 |
| 7,812,357 | B2* | 10/2010 | Kim et al. | 257/94 |
| 7,838,892 | B2* | 11/2010 | Wirth | H01L 33/62 257/594 |
| 7,968,359 | B2* | 6/2011 | Hersee | B82Y 20/00 438/41 |
| 7,968,361 | B2* | 6/2011 | Osawa | H01L 33/22 257/14 |
| 8,093,685 | B2* | 1/2012 | Anzue | H01S 5/02 257/103 |
| 8,163,575 | B2* | 4/2012 | Wierer, Jr. | B82Y 20/00 257/79 |
| 2002/0005523 | A1* | 1/2002 | Taniguchi | H01L 27/153 257/79 |
| 2002/0074561 | A1 | 6/2002 | Sawaki et al. | |
| 2004/0004223 | A1* | 1/2004 | Nagahama | B82Y 20/00 257/74 |
| 2004/0245540 | A1 | 12/2004 | Hata et al. | |
| 2006/0124047 | A1* | 6/2006 | Enokido | B82Y 20/00 117/2 |
| 2006/0208273 | A1* | 9/2006 | Kang | H01L 33/08 257/103 |
| 2007/0164306 | A1 | 7/2007 | Nakahata et al. | |
| 2007/0220713 | A1 | 9/2007 | Choy et al. | |
| 2007/0248132 | A1 | 10/2007 | Kikuchi et al. | |
| 2008/0073743 | A1* | 3/2008 | Alizadeh | B82Y 10/00 257/461 |
| 2008/0318003 | A1 | 12/2008 | Chua et al. | |
| 2009/0267081 | A1 | 10/2009 | Udagawa | |
| 2010/0207138 | A1 | 8/2010 | Nakahata et al. | |
| 2010/0212728 | A1 | 8/2010 | Hori et al. | |

FOREIGN PATENT DOCUMENTS

| | | |
|---|---|---|
| JP | 2007-027298 A | 2/2007 |
| JP | 2007-087992 | 4/2007 |
| JP | 2007-096135 | 4/2007 |
| JP | 2007-514630 A | 6/2007 |
| KR | 10-2007-0013287 A | 1/2007 |
| WO | 2006/025407 A1 | 3/2006 |
| WO | 2006/025793 A1 | 3/2006 |

OTHER PUBLICATIONS

U. Gautam, et al., "GaS and GaSe nanowalls and their transformation to $Ga_2O_3$ and GaN nonowalls," Chem. Commun., 2005, pp. 3995-3997.

A. Kikuchi, et al., "RF-MBE Growth of a GaN nanowall using Ti-mask Selective Area Growth (SAG)," Extended Abstracts, 30a-A-5, Japan Society of Applied Physics and Related Societies, Mar. 27, 2008, p. 410, vol. 55, No. 1.

M. Yoshizawa, et al., Growth of Self-Organized GaN Nanostructures on $Al_2O_3$(0001) by RF-Radical Source Molecular Beam Epitaxy, Jpn. J. Appl. Phys., Apr. 1997, pp. L459-L462, vol. 36, No. 4B, Part 2.

Japanese Office Action dated Nov. 27, 2012 issue in Japanese Application No. 2009-543659.

Gautam et al., "GaS and GaSe nanowalls and their transformation to $Ga_2O_3$ and GaN nanowalls," *Chem. Commun.*, pp. 3995-3997 (2005).

Extended European Search Report dated Feb. 24, 2015, issued by the European Patent Office in counterpart Application No. 08853703.0.

Kishino et al., *InGaN/GaN Nanocolumn LEDs Emitting from Blue to Red*, Proceedings of SPIE, vol. 6473, p. 64730T-1 to 64730T-12 (2007).

\* cited by examiner (a) 3μm (b) 6μm (c) 6μm (d) 1μm (e) 3μm

40μm (a)

(b)

GROUP-III NITRIDE STRUCTURE INCLUDING A FINE WALL-SHAPED STRUCTURE CONTAINING A GROUP-III NITRIDESEMICONDUCTOR CRYSTAL AND METHOD FOR PRODUCING A GROUP-III NITRIDE STRUCTURE INCLUDING A FINE WALL-SHAPED STRUCTURE CONTAINING A GROUP-III NITRIDE SEMICONDUCTOR CRYSTAL

CROSS REFERENCE TO RELATED APPLICATIONS

This application is a National Stage of International Application No. PCT/JP2008/003471 filed Nov. 26, 2008, claiming priority based on Japanese Patent Application No. 2007-306654 filed Nov. 27, 2007, the contents of all of which are incorporated herein by reference in their entirety.

TECHNICAL FIELD

The present invention relates to a group-III nitride structure provided with a fine wall-shaped structure and to a method for producing a group-III nitride structure.

BACKGROUND ART

In recent years, group-III nitride such as gallium nitride (GaN) has been attracting an attention as an element that can realize a high-quality short-wavelength light-emitting diode and laser diode. There are many issues to be solved in putting electronic devices and others that use such a group-III nitride structure into practice.

A technique for growing a semiconductor crystal, for example, the epitaxial technique, the MOCVD (Metal Organic Chemical Vapor Deposition) technique, or the like, has controllability in a lamination direction. Typically, however, in fabricating a structure in an in-plane direction, processing must be carried out using a different technique. The crystal processing technique can be roughly classified into a top-down type in which the crystal is processed after the crystal growth and a bottom-up type in which the substrate is processed before the crystal growth, and the structure is fabricated simultaneously with the crystal growth. In the top-down type, the crystal is damaged in the processing and, in particular, in a fine structure, the surface area is large, thereby raising an issue. On the other hand, by the fabrication method of the bottom-up type, there are many cases in which both the controllability of the structure and the crystal quality can be ensured.

With regard to the nitride semiconductor, there is a method for using a mask such as silicon oxide as a fine structure fabrication technique of bottom-up type. This method in which the crystal is grown selectively on the opening part of the mask is a technique that is practically used in the vapor deposition method. However, in the molecular beam epitaxy method (hereafter referred to as MBE), a polycrystal is deposited on the mask.

M. Yoshizawa and others have found out a method for forming a fine columnar gallium nitride crystal having a diameter of about 100 nm in a self-organizing manner by growing gallium nitride under excessive nitrogen in the MBE using active nitrogen excited by high-frequency plasma as a nitrogen source (See the non-patent document 1).

[non-patent document 1] M. Yoshizawa, A. Kikuchi, M. Mori, N. Fujita, and K. Kishino, Jpn. J. Appl. Phys. Vol. 36 (1997), pp. L459-L462

DISCLOSURE OF THE INVENTION

However, though a columnar fine crystal made of a group-III nitride semiconductor produced by a conventional method is reported, there are few reports on the control of other shapes.

For application of a fine crystal of a group-III nitride semiconductor to devices, reduction of variation in the position and the shape is an object to be achieved. The present invention has been made in view of the above circumstances, and aims at achieving control of the position and the shape of a fine wall-shaped structure by selectively growing the fine wall-shaped structure containing a group-III nitride semiconductor crystal.

The present inventors have made eager studies on the position and the shape control of the growth of a fine wall-shaped structure of nanometer order containing a group-III nitride semiconductor crystal. As a result of this, the present inventors and others have found out that a highly controlled growth of a fine wall-shaped structure can be made and that control of the position and the shape thereof can be made, thereby completing the present invention.

Specifically, according to the present invention, there is provided a group-III nitride structure including a substrate and a fine wall-shaped structure disposed to stand on the substrate in a vertical direction relative to a surface of the substrate and extending in an in-plane direction of the substrate, wherein the fine wall-shaped structure contains a group-III nitride semiconductor crystal, and h is larger than d assuming that the height of the fine wall-shaped structure is h and the width of the fine wall-shaped structure in a direction perpendicular to the height direction and the extending direction is d.

In the present invention, a fine wall-shaped structure having a predetermined shape can be grown on a substrate, and it is possible to obtain a group-III nitride structure including a fine wall-shaped structure containing a highly controlled group-III nitride semiconductor crystal.

Therefore, there can be conceived a possibility of application to various uses that could not be realized with a conventional columnar fine crystal. For example, the structure can be applied to electronic devices and optical devices (for example, light-emitting elements) more easily as compared with a conventional columnar fine crystal. Specifically, by setting the height of the fine wall-shaped structure to be larger than the width of the fine wall-shaped structure, the fine wall-shaped structure can be made of a plurality of layers, for example. This facilitates application to electronic devices and optical devices (for example, light-emitting elements).

Also, in the fine wall-shaped structure of the present invention, the height is larger than the width. This can make the distance between the fine wall-shaped structure side surface and the dislocation be shorter, so that, by interaction of a stress field around the dislocation and the surface, the dislocation slides towards the fine wall-shaped structure side surface and can be made to disappear. Specifically, the probability of the dislocation escaping towards the fine wall-shaped structure side surface is high, so that almost all of the dislocations on the top part of the fine wall-shaped structure can be eliminated. Therefore, the influence of the residual thermal strain that is present in the substrate and the influence of the strain deriving from the lattice mismatch between the substrate and the fine wall-shaped structure can be suppressed, whereby it is possible to obtain a fine wall-shaped structure having almost no dislocation.

Also, according to the present invention, there is provided a method for producing a group-III nitride structure, including forming a mask having an opening on a substrate surface, and introducing a growth source material to the substrate surface so as to grow a fine wall-shaped structure made of a semiconductor crystal in a direction perpendicular to the substrate surface at the opening, wherein the semiconductor crystal contains a group-III nitride semiconductor, the fine wall-shaped structure is disposed to stand in a vertical direction relative to the surface of the substrate and has a shape extending in an in-plane direction of the substrate, and, in the growing of the fine wall-shaped structure, the fine wall-shaped structure continues to be grown until h becomes larger than d, assuming that the height of the fine wall-shaped structure is h and the width of the fine wall-shaped structure in a direction perpendicular to the height direction and the extending direction is d.

By forming a mask having an opening on a substrate surface, a fine wall-shaped structure having a predetermined shape can be formed at least on the substrate surface.

Further, according to the present invention, there is provided a group-III nitride semiconductor optical element including a film having a surface including titanium (Ti) formed in a predetermined region on a surface of a substrate and a fine wall-shaped structure made of a group-III nitride semiconductor formed at least on the surface of the substrate, wherein the fine wall-shaped structure is disposed to stand in a vertical direction relative to the surface of the substrate and extends in one direction in an in-plane direction of the substrate, h is larger than d assuming that the height of the fine wall-shaped structure is h and the width of the fine wall-shaped structure in a direction perpendicular to the height direction and the extending direction is d, and the fine wall-shaped structure contains an active layer.

Also, according to the present invention, there is provided a group-III nitride structure including a substrate and a fine wall-shaped structure disposed to stand on the substrate in a vertical direction relative to a surface of the substrate and extending in an in-plane direction of the substrate, wherein the fine wall-shaped structure contains a group-III nitride semiconductor crystal, h is larger than d assuming that the height of the fine wall-shaped structure is h and the width of the fine wall-shaped structure in a direction perpendicular to the height direction and the extending direction is d, a mask having an opening and containing titanium oxide is disposed on the surface of the substrate, and the fine wall-shaped structure is disposed to stand in a vertical direction relative to the surface of the substrate with the opening serving as a starting point.

The present invention provides a fine wall-shaped structure having a predetermined shape and containing a group-III nitride semiconductor crystal. This realizes a high-degree control of the position and the shape of a group-III nitride structure.

BRIEF DESCRIPTION OF THE DRAWINGS

The above-described objects as well as other objects, features, and advantages will be made further clearer by the preferable embodiments described below and the following drawings associated therewith.

BEST MODE FOR CARRYING OUT THE INVENTION

Hereafter, embodiments of the present invention will be described with reference to the drawings.

Figure 1:
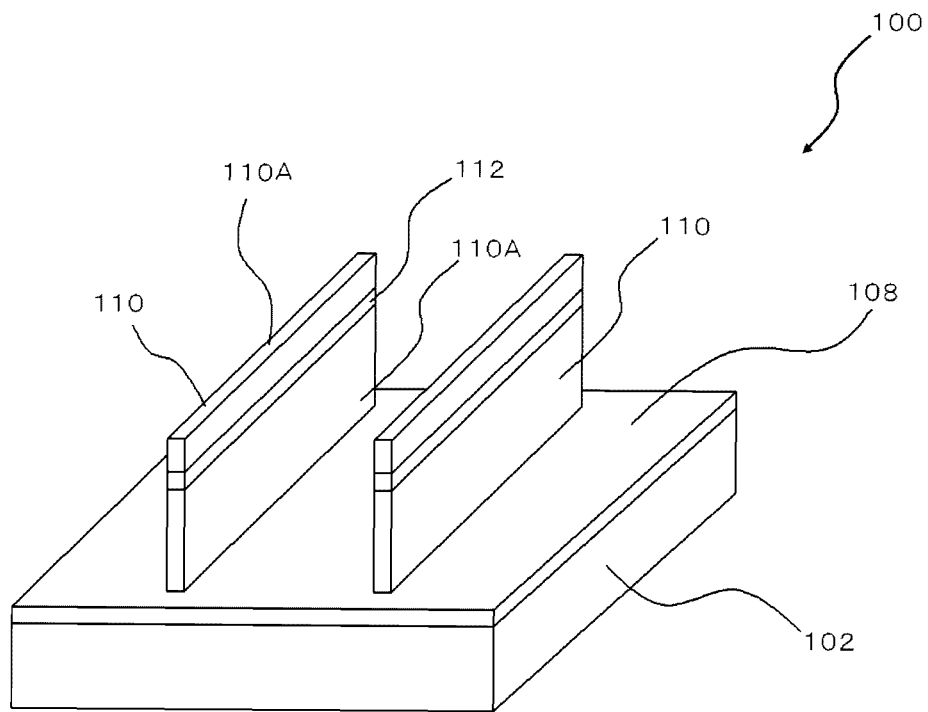
FIG. 1 is a conceptual view illustrating a group-III nitride structure of the present embodiment.

Referring to FIG. 1, a group-III nitride structure 100 in the present embodiment includes a substrate 102 and a fine wall-shaped structure 110 disposed to stand on the substrate 102 in a vertical direction relative to a surface of the substrate 102 and extending in an in-plane direction of the substrate 102. Further, the fine wall-shaped structure 110 contains a group-III nitride semiconductor crystal. Here, the fine wall-shaped structure 110 is formed at least on the surface of the substrate 102. Hereafter, in the present embodiment, an aspect will be described in which the fine wall-shaped structure 110 is formed selectively on the surface of the substrate 102. The fine wall-shaped structure 110 is $Al_xGa_yIn_{1-x-y}N$ ($0 \leq x \leq 1$, $0 \leq y \leq 1$, and $0 \leq x+y \leq 1$) and, above all, preferably contains GaN.

Here, the fine wall-shaped structure may also be referred to as a nanowall. The fine wall-shaped structure 110 containing a group-III nitride semiconductor crystal in the present embodiment is disposed to stand in a vertical direction relative to a surface of the substrate 102 and extends in an in-plane direction of the substrate 102. Also, the fine wall-shaped structure 110 in the present embodiment is a single crystal of a wall-shaped structure having a cross-section made with a size of nanometer order in a direction perpendicular to the height direction and the extending direction. Also, h is larger than d assuming that the height of the fine wall-shaped structure 110 is h and the width of the fine wall-shaped structure 110 in a direction perpendicular to the height direction and the extending direction is d. Therefore, the fine wall-shaped structure 110 of the present embodiment does not contain a crystal having a thin film that is formed on the substrate 102 to extend more widely in the width direction than in the height direction. For example, the ratio (h/d) is preferably 2 or more and 200 or less. When the fine wall-shaped structure 110 has a height of a certain degree, manifold structures can be formed in the inside. As a result of this, a possibility of use as various devices can be expected. Here, for the height and the width of the fine wall-shaped structure 110 as referred to herein, average values thereof are used.

Alternatively, the fine wall-shaped structure 110 in the present embodiment may be formed as a connected body of a fine wall-shaped structure 110 in which a plurality of fine wall-shaped structures 110 are connected. By forming a connected body, the crystal may be subjected to bending, branching, or the like to obtain fine wall-shaped structures 110 of various shapes. Also, in the fine wall-shaped structure 110 in the present embodiment, the crystal surface appears on the crystal side surface, so that an extremely flat side surface can be easily obtained. Since the fine wall-shaped crystal in the present embodiment grows from a single growth nucleus, the crystal contains almost no threading dislocation.

Here, as the reason why the crystal contains almost no threading dislocation, the following reasons may be considered.
(i) It can be conceived that a stress is present at the interface between the fine wall-shaped crystal and the substrate as a mechanism for suppressing propagation of the threading dislocations from the substrate.
(ii) Also, in the fine wall-shaped structure 110, the distance between the crystal side surface and the dislocations is extremely small, so that the dislocations slide towards the crystal side surface to disappear by interaction between the stress field around the dislocations and the surface.
(iii) The width of the crystal nucleus at the initial stage of growth is extremely small to be, for example, several hundred nm. When a GaN substrate is used as the substrate 102, the surface directions are also aligned. For this reason, even when independently formed fine growth nuclei are bonded, a low-angle grain boundary is hardly formed, and the growth nuclei are bonded with no dislocation.
(iv) Further, when the mask 108 is formed by dry etching, a multiple defect layer or a strain layer by process damages is formed on the surface of the exposed substrate 102. The dislocations that have propagated from the substrate 102 disappear or are bent in this region, and do not propagate to the fine wall-shaped structure 110.

Figure 13:
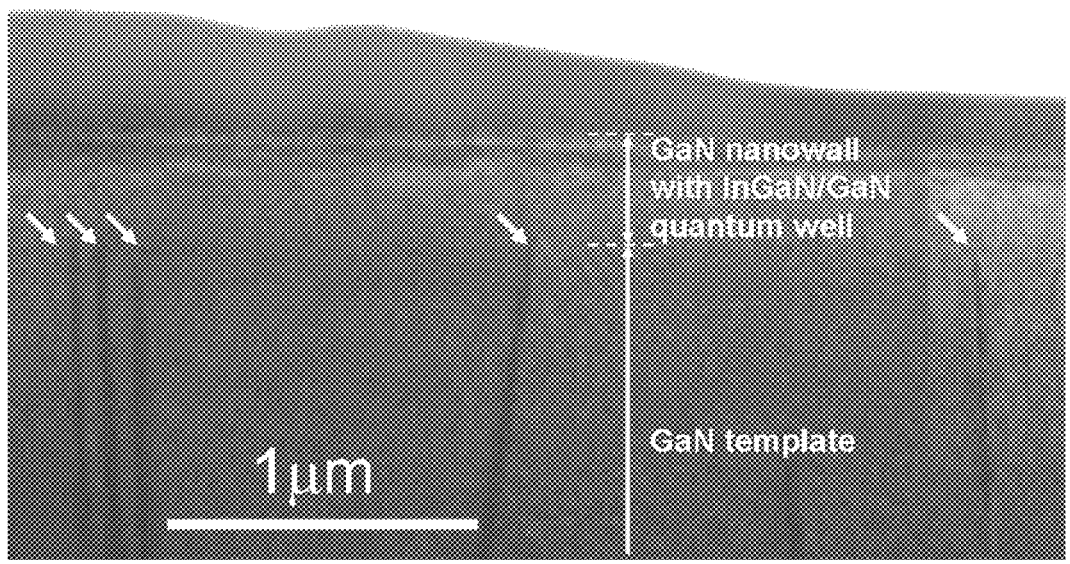
FIG. 13 is a view showing a state in which the propagation of threading dislocation is suppressed.

As shown in FIG. 13, a state in which the dislocations are suppressed at the growth interface has been confirmed by a cross-sectional transmission electron microscope (arrow symbol).

Figure 2:
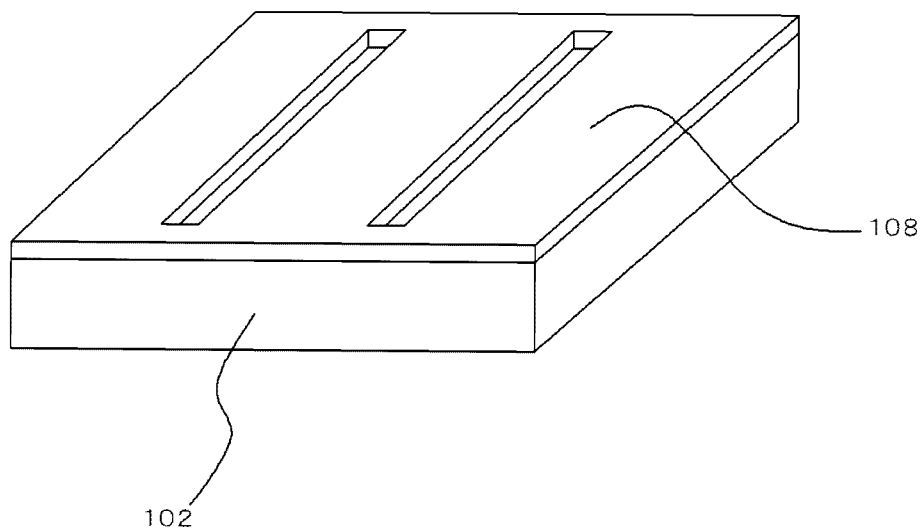
FIG. 2 is a conceptual view illustrating a shape of a mask in the present embodiment.

In the group-III nitride structure of the present embodiment, a mask 108 having an opening is formed further on the substrate 102. FIG. 2 is a view showing a shape of the mask 108 before the fine wall-shaped structure is formed. The fine wall-shaped structure 110 is disposed to stand in a vertical direction relative to the surface of the substrate 102 with the opening of the mask 108 serving as a starting point. Here, the mask 108 is preferably a film having a surface made of metal (which may hereafter also be referred to as a metal film).

The fine wall-shaped structure 110 of the present embodiment can assume various shapes. Also, the fine wall-shaped structure 110 can be formed with various patterns by controlling the pattern shape of the opening that is formed in the mask 108. The shape, the width, the height, and the like of the fine wall-shaped structure 110 may vary depending on the growth condition of the crystal; however, they are typically as follows. When the width, the height, and the like are within the following ranges, the fine wall-shaped structure 110 has extremely few threading dislocations.

The shape of the fine wall-shaped structure 110 is a shape that extends in an in-plane direction in a top view. For example, in the fine wall-shaped structure 110, the width d of the cross-section in a direction perpendicular to the extending direction has a size of nanometer order. Such a width d of the fine wall-shaped structure 110 is, for example, 10 nm or more and 1,000 nm or less, preferably 50 nm or more and 600 nm or less. By setting d to be 600 nm or less, the fine wall-shaped structure 110 has an extremely small width and has particularly few dislocations.

Also, the height h of the fine wall-shaped structure 110 from the substrate surface is 20 nm or more and 10,000 nm or less, preferably 100 nm or more and 6,000 nm or less, still more preferably 100 nm or more and 2,000 nm or less. Further, the ratio (h/d) of the height h of the fine wall-shaped structure 110 to the width d of the fine wall-shaped structure 110 in a direction perpendicular to the height direction and the extending direction is larger than the height h, and is preferably 2 or more and 200 or less, still more preferably 4 or more and 50 or less.

The length of the fine wall-shaped structure 110 in the extending direction is not particularly limited; however, the length is, for example, 100 nm or more and 2 cm or less. The length of the fine wall-shaped structure includes both the length of a linear structure and the length in a case having a turning structure as a connected body.

However, the above numerical values are exemplifications, and the shape of the fine wall-shaped structure 110 may vary in a complex relation to the kind and the shape of the substrate or the mask, the metal film thickness, the condition of crystal growth, and the like.

Figure 3:
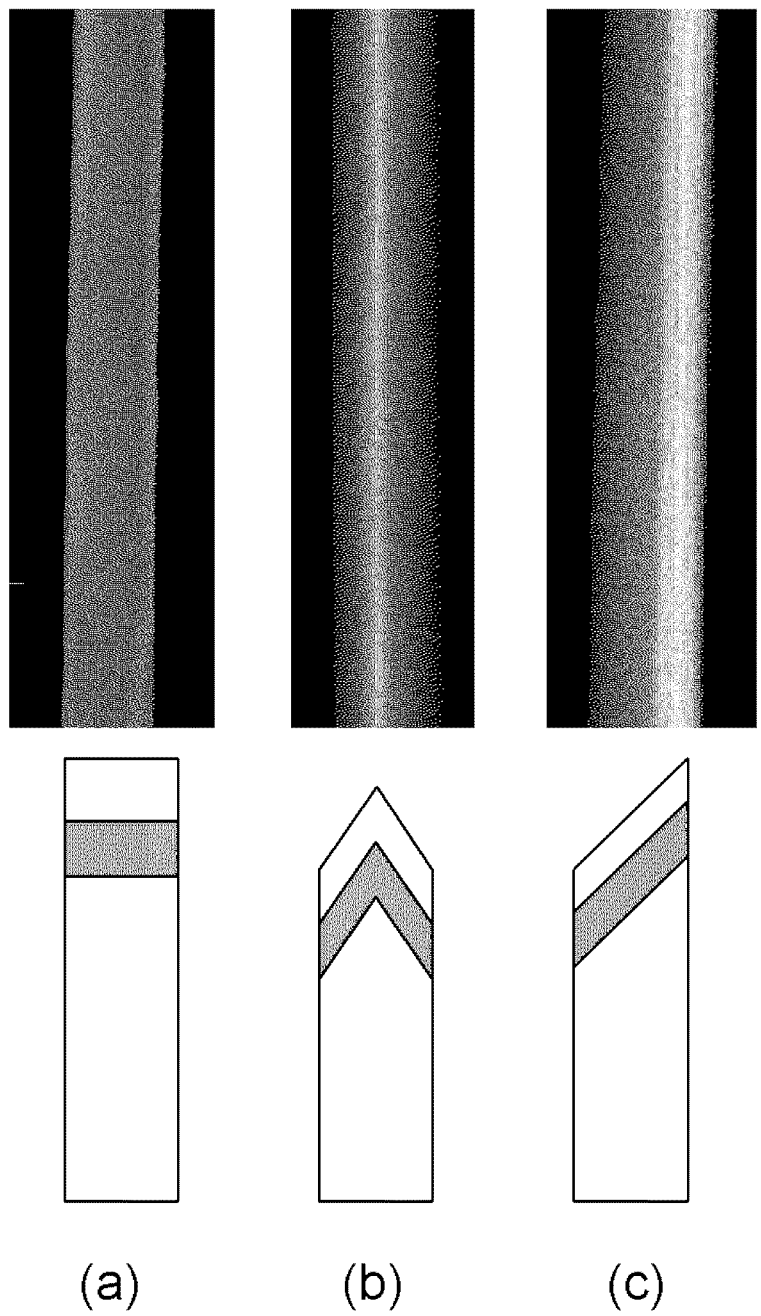
FIG. 3 is a view illustrating a shape of a top crystal surface of a fine wall-shaped structure.
Figure 4:
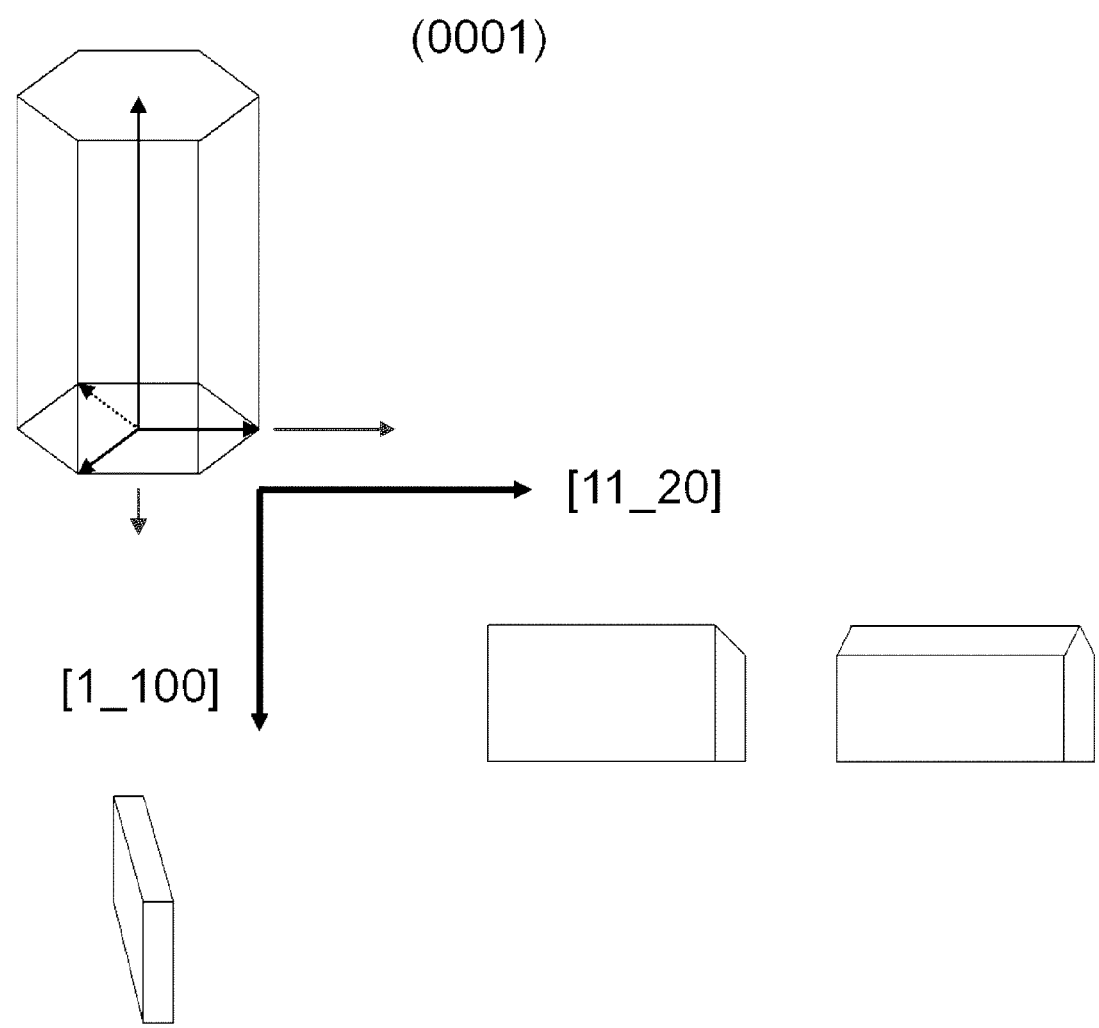
FIG. 4 is a view illustrating a relationship between the fine wall-shaped structure and the top crystal surface thereof.
Figure 5:
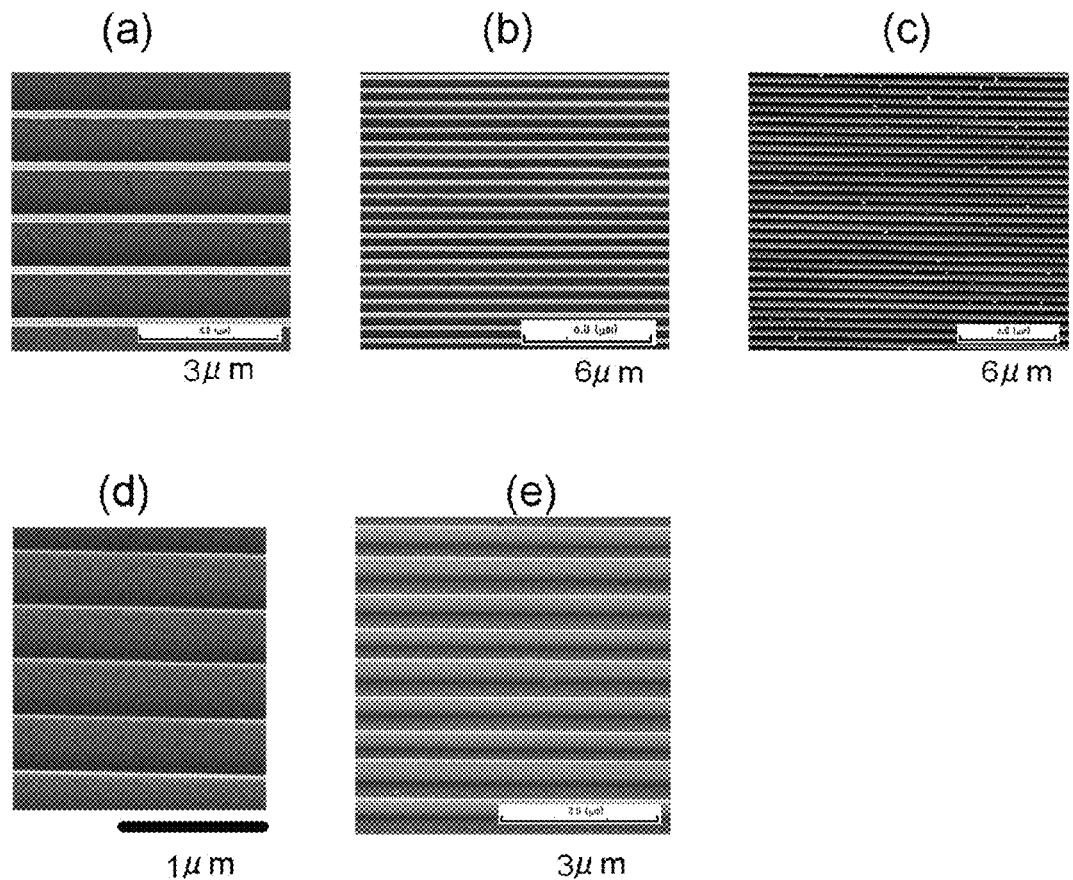
FIG. 5 is a view showing an SEM image of a GaN fine wall-shaped structure that has grown on a GaN thin film crystal substrate having a Ti film formed thereon.

In the fine wall-shaped structure 110 of the present embodiment, the top surface of the crystal may assume various shapes. For example, the top crystal surface of the fine wall-shaped structure 110 is a surface vertical to the crystal side surface, in other words, a surface horizontal to the substrate surface (FIG. 3(a)). When the top surface of the crystal is liable to be a (0001) surface in the growth condition, such a surface shape may be assumed (FIG. 4). Also, when the top surface of the crystal is liable to be (11-20), the top crystal surface is oblique relative to the substrate surface (FIG. 4). At this time, there are a case where two surfaces are formed in a triangular pyramid shape and a case where an oblique surface of a single surface is formed (FIGS. 3(b) and 3(c)). When the top crystal surface is formed obliquely, the inclination angle of such a surface is, for example, about 45 degrees relative to the substrate surface. The shape of the top crystal surface can be controlled by adjusting the growth condition, the interval of the fine wall-shaped structures 110, and the like.

In a group-III nitride quantum well structure formed on the (0001) surface, there is a case where a piezoelectric field deriving from a lattice mismatch is generated in a direction perpendicular to the quantum surface, whereby electrons and positive holes are spatially separated from each other in the quantum well, leading to decrease in the light emission efficiency. On the other hand, with a semipolar surface that is tilted obliquely from the (0001) surface, the generation coefficient of the piezoelectric field is smaller as compared with the (0001) surface, and is 0 at a specific angle. For this reason, when an oblique facet having an oblique top crystal surface is used in a light-emitting element, a quantum well having a high light emission efficiency can be obtained.

In the present embodiment, when a metal film is used as a mask 108, the metal may be preferably a metal having a high melting point. For example, the metal is titanium, tungsten, molybdenum, or the like. Among these, titanium is preferable. The metal film may be subjected to a nitriding process. For example, the metal film may be titanium nitride (TiN) or the like.

Also, as the mask 108, a titanium oxide film ($TiO_2$ film) may be used. Since titanium oxide is stable in ambient air, there is little change with lapse of time, and an effect of improving the reproducibility of the selective growth can be expected. In forming the mask 108, a Ti film may be oxidized to form a titanium oxide film, or a titanium oxide film may be made from the beginning.

The fine wall-shaped structure 110 in the present embodiment may be made of a plurality of layers. For example, the fine wall-shaped structure 110 may have a plurality of different layers. For example, as shown in FIG. 1, the fine wall-shaped structure 110 includes a different semiconductor layer 112 made of a material different from the material (semiconductor layer 110A) mainly constituting the fine wall-shaped structure 110, at a predetermined position in the height direction. Such a different semiconductor layer 112 is, for example, an active layer, namely a site having a functionality such as control of the light emission or the direction in which the electric current flows. Such a group-III nitride structure can be used as a group-III nitride semiconductor optical element containing an active layer 112.

Here, the active layer 112 is made, for example, of InGaN, GaN, AlGaN, AlInGaN, InGaAsN, InN, or the like.

Also, the semiconductor layer 110A has a different composition from the active layer 112, and is made, for example, of InGaN, GaN, AlGaN, AlInGaN, InGaAsN, InN, or the like.

Specifically, the group-III nitride semiconductor optical element in the present embodiment is formed, for example, of a MQW (multiple quantum well) structure made of InGaN/GaN (or $In_xGa_{1-x}N/In_yGa_{1-y}N$ (0<x<1, 0<y≤1, and x>y), GaN/AlGaN, or $Al_xGa_{1-x}N/Al_yGa_{1-y}N$ (0<x<1, 0<y<1, and x<y) or a SQW (single quantum well) structure.

The fine wall-shaped structure 110 in the present embodiment has the following characteristics.

First, unlike the fine columnar crystal referred to as a nanocolumn, the fine wall-shaped structure 110 in the present embodiment has a shape extending in an in-plane direction of the substrate. On the other hand, the fine columnar crystal has a rod-like shape having a generally circular cross-section. With the fine wall-shaped structure 110, a possibility to various uses that could not be realized by the fine columnar crystal can be considered. By subjecting the fine wall-shaped structure 110 to bending, bonding, branching, or the like, application to various optical or electronic circuits can be expected. For example, by using a shape in which the fine wall-shaped structure 110 extends in one direction, application to optical waveguides, interconnects, and the like can be considered.

Also, in the fine wall-shaped structure 110 in the present embodiment, the crystal surface appears on the side surface, so that an extremely flat side surface can be easily obtained. Also, the vertical degree of the side surface is extremely high, so that, even if the fine wall-shaped structures 110 grow at a high density, independence from each other can be maintained. By using such an excellent verticalness, application to a variable grating in which the interval of the fine wall-shaped structures 110 are made variable by use of standing wave of supersonic can be considered.

Here, the side surface of the fine wall-shaped structures 110 is disposed to stand generally vertically relative to the substrate surface at an angle of, for example, 87 degree or more and 93 degree or less. Preferably, the side surface of the fine wall-shaped structures 110 is disposed to stand vertically relative to the substrate surface.

Secondly, by making the fine wall-shaped structure 110 in the present embodiment into a structure having a plurality of different layers, further application in the field of electronic devices and optical devices is possible. For example, by making a fine wall-shaped structure 110 of a hetero-structure having an active layer such as described above, it is possible to impart an excellent light emission property.

Further, with the fine wall-shaped structure 110 in the present embodiment, the crystal surface shape of the top part can be controlled. Therefore, a nonpolar or semipolar quantum well can be used. By this, a highly efficient optical device having a smaller wavelength shift can be obtained.

From the above, application of the fine wall-shaped structure 110 in the present embodiment to light-emitting devices can be expected. Also, application to an electrolytic field emission element, a ring resonator, a three-dimensional reflection mirror, or other novel-functional elements can be considered.

Next, a method for producing a group-III nitride structure 100 in the present embodiment will be described.

First, in a predetermined region on the surface of a substrate 102, a film having a surface made of titanium (Ti) (hereafter, Ti film) is formed as a mask 108. The Ti film has an opening with a predetermined pattern. In forming the Ti film, a pattern is formed in a predetermined region by using an electron beam (EB) technique.

Specifically, first, a Ti film is vapor-deposited on the surface of the substrate 102. The Ti film thickness is not particularly limited; however, the thickness is preferably 2 nm or more and 100 nm or less. In the present embodiment, a gallium nitride (GaN) thin film crystal is used as the substrate 102. The thickness of the GaN thin film crystal is, for example, 20 nm or more and 6 μm or less. Thereafter, an EB resist is applied onto the Ti film 108. Subsequently, by electron beam lithography, a desired nano-pattern is formed on the EB resist. By performing dry etching to remove the Ti film, an opening is formed at a desired position (FIG. 2). By the above steps, a Ti film having an opening with a desired pattern is formed.

Also, besides the above-described method, the following methods may be used. For example, in the lifting method, first, a resist is applied onto a substrate, and a pattern is formed by electron beam lithography. Thereafter, a metal film such as Ti is vapor-deposited, and a Ti pattern is formed by removing the resist and the Ti film located thereon. Alternatively, in the focused ion beam method, the metal film such as Ti is directly removed by etching with a Ga ion, so as to form a Ti pattern.

After a mask 108 made of the Ti film is formed, a growth source material is introduced to the surface of the substrate 102, and a fine wall-shaped structure 110 (semiconductor layer 110A) made of gallium nitride (GaN) is grown as a group-III nitride semiconductor crystal. In such a step, at the opening, the fine wall-shaped crystal 110 made of a semiconductor crystal is grown in a direction perpendicular to the surface of the substrate 102. Here, the region on the Ti film functions as a growth suppression region of the fine wall-shaped structure 110, whereby the growth of the fine wall-shaped structure 110 is suppressed. As shown in FIG. 1, in the present embodiment, with use of the Ti film as a mask 108, the fine wall-shaped structure 110 is grown selectively on only the surface of the substrate 102 along the opening pattern of the mask 108.

At this time, the fine wall-shaped structure 110 is not grown on the mask 108.

Further, atoms of In, Ga, and N are introduced to the surface of the substrate 102 as a growth source material, whereby a layer made of InGaN is grown on the fine wall-shaped structure 110 (semiconductor layer 112). This InGaN layer is formed with a height of 1 nm to 10 nm. Subsequently, by supplying atoms of Ga and N, a GaN layer (semiconductor layer 110A) is further formed with a height of 1 nm to 10 nm. By supplying different growth source materials in this manner, a fine wall-shaped structure 110 of a hetero structure having a plurality of layers is formed.

The cross-sectional shape of the opening in the vertical direction is not particularly limited, and may be an inverse taper shape in which the width becomes smaller as it comes closer to the groove bottom part, a taper shape in which the width becomes larger as it comes closer to the groove bottom part, or a shape such that the side surface of the opening is vertical to the surface of the substrate 102.

The mask 108 made of a Ti film can be formed with a predetermined pattern in a predetermined region. The predetermined pattern shape is not particularly limited; however, the pattern shape may be a stripe shape, a ring shape, a radial shape, a mesh shape, or the like (FIGS. 5 to 9). By this, a fine wall-shaped structure 110 having a stripe shape, a ring shape, a radial shape, a mesh shape, or the like can be obtained.

In the present embodiment, a fine wall-shaped structure 110 having an extremely high vertical degree of the side surface can be easily obtained. Therefore, even if the stripe pattern is formed at a high density, nanowalls having a high density can be grown. For example, high-density nanowalls having an interval of 100 nm or less can be grown independently from each other.

The size of the mask pattern for growing the fine wall-shaped structure 110 to be a stripe shape or the like is not particularly limited; however, the line width or the diameter of the opening formed in the mask 108 may be set to be, for example, 20 nm or more and 3 µm or less, preferably 50 nm or more and 800 nm or less.

For the growth of the fine wall-shaped structure 110, the MBE method is used in the present embodiment. A growth gas containing active nitrogen excited by a high-frequency plasma and a group-III metal described above is introduced simultaneously as a growth source material to the substrate surface, so as to grow the fine wall-shaped structure 110. The growth condition at this time is set to be a condition such that the effective supply amount ratio of active nitrogen to the group-III metal is made larger as compared with the group-III metal, whereby a wall-shaped crystal grows.

The growth temperature is preferably 350° C. or more and 1,200° C. or less.

However, in the case of GaN, for example, when the crystal growth temperature is set to be 600° C. or less, the GaN crystal grows in many cases also on the growth suppression region. On the other hand, as the growth temperature is raised, the spatial density of GaN that grows in the growth suppression region decreases. Eventually, by adjusting the growth condition, it is possible to obtain a state in which GaN is not grown in the growth suppression region. The growth temperature for selectively growing the fine wall-shaped structure 110 along the opening pattern of the mask of the Ti film may be, for example, 850° C. or more and 1,200° C. or less depending on the supply amount and the ratio of the group-III metal and the active nitrogen.

The present embodiment is characterized in that the fine wall-shaped structure 110 is formed by using the MBE method. Typically, in the crystal growth using the MBE method, even if a mask is used, a crystal having a thin film shape grows on the whole substrate to cover the mask. Therefore, it has been difficult to grow a crystal having a specific shape selectively at only the opening pattern of the mask. However, in the present embodiment, by patterning a film or the like having a surface including a specific metal on the substrate as a mask and adjusting the growth condition of the crystal, precise position and shape control of the fine crystal including a group-III nitride semiconductor can be made possible. In particular, in the present embodiment, it has been found out that a fine wall-shaped structure of nanometer order can be obtained using a metal film as a mask. Obtaining such a fine wall-shaped structure could not be carried out in the past.

In order to grow the fine wall-shaped structure 110, the MBE is preferably carried out under the following condition. The temperature is suitably selected depending on the kind of the group-III nitride semiconductor to be grown; however, the temperature is within a range of 350° C. or more and 1,200° C. or less. For example, in the case of GaN, the temperature is 400° C. or more and 1,000° C. or less. In the case of AlN, the temperature is 500° C. or more and 1,200° C. or less. In the case of InN, the temperature is preferably 350° C. or more and 600° C. or less. By performing the MBE within the above-described temperature range under a condition of rich nitrogen, the fine wall-shaped structure 110 of nitride semiconductor can be grown.

The MBE method can be used in the same manner in forming a layer such as an active layer different from the material that mainly forms the fine wall-shaped structure 110. For example, the substrate temperature is set to be 450° C. or more and 800° C. or less, and a growth source material having a constant composition ratio is supplied. Informing the InGaN layer, the ratio is set to be, for example, $In_xGa_{1-x}N$ (x=0 to 0.5).

As described above, the fine wall-shaped structure 110 can be formed to stand in a vertical direction from the surface of the substrate 102 along the opening of the mask 108. Also, since the growth of the fine wall-shaped structure 110 is suppressed on the above-described mask 108, the position and the shape of the fine wall-shaped structure 110 can be controlled by forming a mask 108 in a desired pattern.

In the present embodiment, a case has been described in which the fine wall-shaped structure 110 is not grown on the mask 108, and the fine wall-shaped structure 110 is grown selectively on only the surface of the substrate 102 on which the mask 108 is not formed; however, a GaN crystal may be formed on the mask 108. In this case also, the growth of the fine wall-shaped structure 110 is suppressed on the mask 108. The suppression as referred to herein includes also a case where the fine wall-shaped structure 110 is not formed at all, or the like case.

The reason why the growth of the fine wall-shaped structure 110 is suppressed by the above-described mask 108 is not necessarily clear and does not go beyond a range of conjecture; however, the reason is as follows. The fine wall-shaped structure 110 grows at least on the substrate surface where a mask such as a metal film is not formed, and the growth of the fine wall-shaped crystal is suppressed on the mask. This is conjectured to be due to the fact that, in the case of a metal film, for example, elimination of gallium (Ga) or the like is promoted more on the surface thereof than on the substrate 102. When the substrate temperature during the growth of the fine wall-shaped structure 110 is observed by an infrared radiation thermometer, it has been confirmed that the temperature is higher on the metal film 108 than on the substrate 102. Though it is not necessarily clear, it seems that the time from the surface diffusion to the evaporation of supplied Ga atoms, for example, is shorter on the metal film 108 than on the silicon substrate 102, and the total number of Ga atoms involved in the crystallization is smaller on the metal film 108 than on the silicon substrate 102. As a result of this, it seems that the growth of the fine wall-shaped structure 110 is suppressed on the metal film 108 as compared with the other regions.

Also, it can also be considered that the kind of the metal that is vapor-deposited on the substrate greatly affects the suppression. When attention is paid to a physical property of the metals such as Ti, these have a higher melting point or boiling point than other metals; the bonding energy per covalent bond is high; and the thermal conductivity is low as compared with other metals. Also, Ti or the like has fewer unbonded hands on the surface because of the strength of the covalent bond. From this fact, it can be conjectured that facility of bonding cannot be expected, and the start of growth of the group-III nitride fine wall-shaped crystal is suppressed.

Also, in growing the crystal, active nitrogen is radiated either alone or simultaneously with a group-III metal onto the metal film surface. In the case of a metal (Ti or W) having a nitride-forming function, it is conjectured that a metal nitride (for example, TiN, WN, or the like) is formed. Since these metal nitrides are chemically stable, namely, few active unbonded hands are present on the surface, the bonding with Ga, GaN, or the like is weak. Therefore, it can also be considered that, in the case of a growth temperature sufficient for Ga, GaN, or the like to be eliminated from the surface, the supplied Ga or GaN is eliminated before coming to have a size sufficient for the crystal growth to be maintained, thereby suppressing the growth of GaN.

From the above, in particular, a synergistic effect of the fact that the temperature on the mask is higher as compared with the substrate surface and the fact that the growth nucleus of GaN is hardly formed on the mask can be anticipated.

On the other hand, on the exposed surface of the substrate 102 where the mask 108 is not formed, suppression of the crystal growth does not occur. Therefore, as a result, the fine wall-shaped structure 110 is formed selectively on the exposed surface of the substrate 102 rather than on the mask 108. Typically, the fine wall-shaped structure 110 formed on the substrate 102 grows to stand upright generally in a direction perpendicular to the substrate 102.

As shown above, the embodiments of the present invention have been described with reference to the drawings; however, these are exemplifications of the present invention, so that various constructions other than the above can be adopted within a range that does not depart from the gist of the present invention.

For example, in the above-described embodiments, description was made by raising a fine wall-shaped structure made of GaN as an example. However, as a constituent material of the fine wall-shaped structure, a group-III nitride semiconductor other than GaN, for example, a nitride semiconductor represented by the general formula of $Al_xGa_yIn_{1-x-y}N$ ($0 \leq x \leq 1$, $0 \leq y \leq 1$, and $0 \leq x+y \leq 1$) such as AlN, InN, AlGaN, InGaN, or AlInGaN, a boron nitride such as BN can be used.

Also, in the above-described embodiments, a gallium nitride thin film crystal was used as a material of the substrate; however, the material is not limited to this alone, so that a single crystal silicon, SiC, $SiO_2$, $Si_3N_4$, sapphire substrate, or the like can be used.

Regarding the method for growing the fine wall-shaped structure 110, an example using the MBE has been shown in the above-described embodiments; however, the metal organic chemical vapor deposition method (MOCVD), the metal organic vapor phase epitaxy (MOVPE) method, or the hydride vapor phase epitaxy (HYPE) method may be used as well.

Also, in the above-described embodiments, assuming that the height of the active layer 112 is a and the width of the above active layer 112 in a direction perpendicular to the height direction and the extending direction is b, the ratio (a/b) of these may be set to be 0.0002 or more and 4 or less.

Also, the height a of the active layer 112 is preferably one molecule layer (0.2 nm) or more and 500 nm or less in view of exhibition of the quantum effect and increase in the injection current density.

Also, in the case of a fine wall-shaped structure 110 in which the width d is made of a size of nanometer order, the light confinement coefficient can be increased by increasing the thickness of the active layer 112.

Hereafter, Examples of the present invention will be described further in detail.

EXAMPLES

Example 1

Ti having a thickness of 6 nm to 18 nm was vapor-deposited on a GaN thin film crystal. By electron beam (EB) lithography, a nano-pattern of EB resist was formed. Subsequently, by dry etching, the Ti film was removed, so as to form a desired Ti film pattern. The Ti film pattern was set to be a stripe pattern such as shown in FIG. 5(a). As the Ti film pattern, a linear Ti film with an opening having a width of 300 nm±200 nm was formed with a period of 1 μm. After the substrate was transported to an ultrahigh vacuum chamber, active nitrogen excited by high-frequency plasma was radiated onto the substrate surface to perform a nitriding process for 10 minutes at a substrate temperature of 400° C. and for 3 minutes at 800° C. Next, active nitrogen excited by radiation high-frequency plasma and gallium were simultaneously radiated at a growth temperature of 770° C., so as to grow a fine wall-shaped structure of gallium nitride (GaN) for 1 hour. The growth condition at this time was set to be a condition such that the effective supply amount of active nitrogen was made larger as compared with gallium so that a columnar crystal would grow. Also, in order to make a fine wall-shaped structure having a plurality of layers, In, Ga, and N atoms were introduced as growth source materials in the midway, so as to form an InGaN layer.

FIG. 5(a) is a view showing an SEM image of the substrate surface after the GaN fine wall-shaped crystal was grown. In the Figure, the white part is a GaN fine wall-shaped crystal, and the black part is a Ti film. By using the Ti film as a mask, the fine wall-shaped crystal could be selectively grown. The obtained GaN fine wall-shaped structure had a height h being about 1,000 nm, a width d in a direction perpendicular to the height direction and the extending direction being about 300 nm, and a ratio (h/d) of these being about 3.3. Also, the length of the GaN fine wall-shaped structure was 6 μm or more.

Also, electron microscope observation was carried out on the plurality of fine wall-shaped structures formed on the substrate. It was confirmed that all of the fine wall-shaped structures had been formed at an angle of 89 to 91 degrees relative to the substrate surface. In the present Example, the fine wall-shaped crystal could be selectively grown by using the Ti film as a mask.

Figure 10:
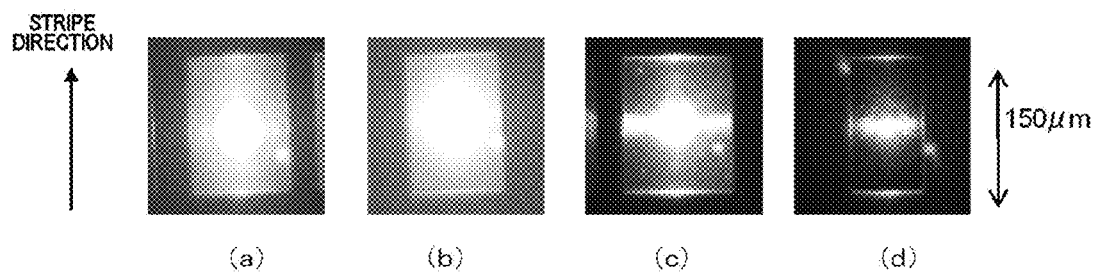
FIG. 10 is a view showing a result of microscopic PL measurement on a GaN fine wall-shaped structure.
Figure 11:
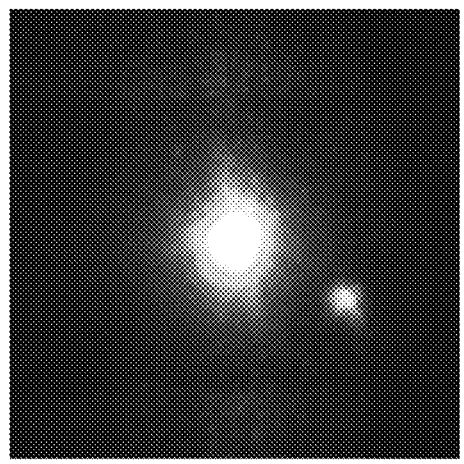
FIG. 11 is a view showing a result of microscopic PL measurement on the GaN fine wall-shaped structure.
Figure 11:
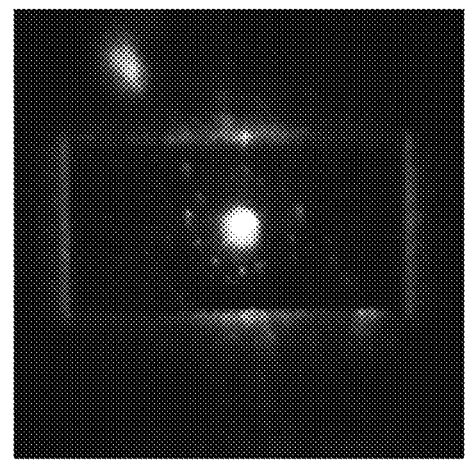

Further, the obtained fine wall-shaped crystal was evaluated. FIG. 10 shows a result of performing a microscopic PL (Photo Luminescence) measurement on the obtained GaN fine wall-shaped crystal. Here, an object lens having a magnification of 20 times was used, and HeCd having a wavelength of 325 nm was used as excitation light. The arrow symbol shows a stripe direction of the fine wall-shaped crystal. By FIGS. 10(a) to 10(d), light emission of blue color (FIG. 10(a)), green color (FIG. 10(b)), yellow color (FIG. 10(c)), and orange color (FIG. 10(d)) were confirmed, respectively. Also, FIGS. 11(a) and 11(b) are views showing a result of performing a microscopic PL measurement under a similar condition respectively on a GaN fine columnar crystal (nanocolumn) and a GaN continuous thin film crystal. In the microscopic PL measurement of these, the central high-brightness part is an excitation condensation part, and image capturing was carried out all under the same exposure condition. As shown in FIG. 10, in the present Example, a strong PL light emission was confirmed.

Examples 2 to 5

A stripe-shaped GaN fine wall-shaped crystal was grown under the same condition as in the Example 1 except that the Ti film pattern was changed. FIGS. 5(b) to 5(e) show an SEM image of the substrate surface after the GaN fine wall-shaped crystal was grown. The obtained GaN fine wall-shaped crystal had a height h being about 350 nm to about 1,000 nm, a width d in a direction perpendicular to the height direction and the extending direction being about 100 nm to about 400 nm, and a ratio (h/d) of these being about 1.1 to about 10. Also, the length of the GaN fine wall-shaped structure was 15 µm or more, 20 µm or more, 2 µm or more, and 6 µm or more, respectively.

Also, electron microscope observation was carried out on the plurality of fine wall-shaped structures formed on the substrate. It was confirmed that all of them had been formed at an angle of 89 to 91 degrees relative to the substrate surface.

Further, in the fine wall-shaped crystals of the present Examples, strong PL light emissions were confirmed.

Example 6

Figure 6:
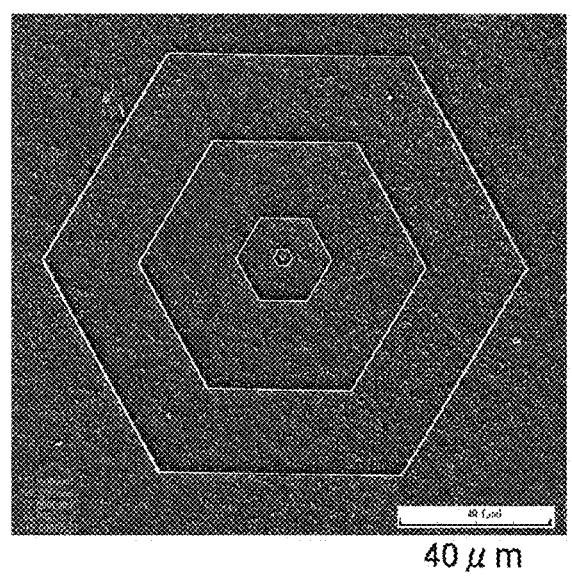
FIG. 6 is a view showing an SEM image of a GaN fine wall-shaped structure that has grown on a GaN thin film crystal substrate having a Ti film formed thereon.

A GaN fine wall-shaped crystal was grown under the same condition as in the Example 1 except that the Ti film pattern was changed to a shape of a ring resonator structure. FIG. 6 shows an SEM image of the substrate surface after the GaN fine wall-shaped crystal was grown.

The height h of the obtained GaN fine wall-shaped crystal was about 300 nm to about 1,000 nm. The width d of the fine wall-shaped crystal in a direction perpendicular to the direction in which the fine wall-shaped crystal extends in an in-plane direction was about 100 nm to about 300 nm. The ratio (h/d) of these was about 3 to about 10. The length was about 150 µm. The designed value of the InGaN active layer was set to be such that the height a was about 3 nm and the number of layers was 1. The width b of the InGaN layer is the same as the above d. The ratio of the height a and the width b of the InGaN active layer was about 0.01 to about 0.03. Also, electron microscope observation was carried out on the plurality of fine wall-shaped structures formed on the substrate. It was confirmed that all of them had been formed at an angle of 89 to 91 degrees relative to the substrate surface. In the fine wall-shaped crystal of the present Example, a strong PL light emission was confirmed.

Example 7

Figure 7:
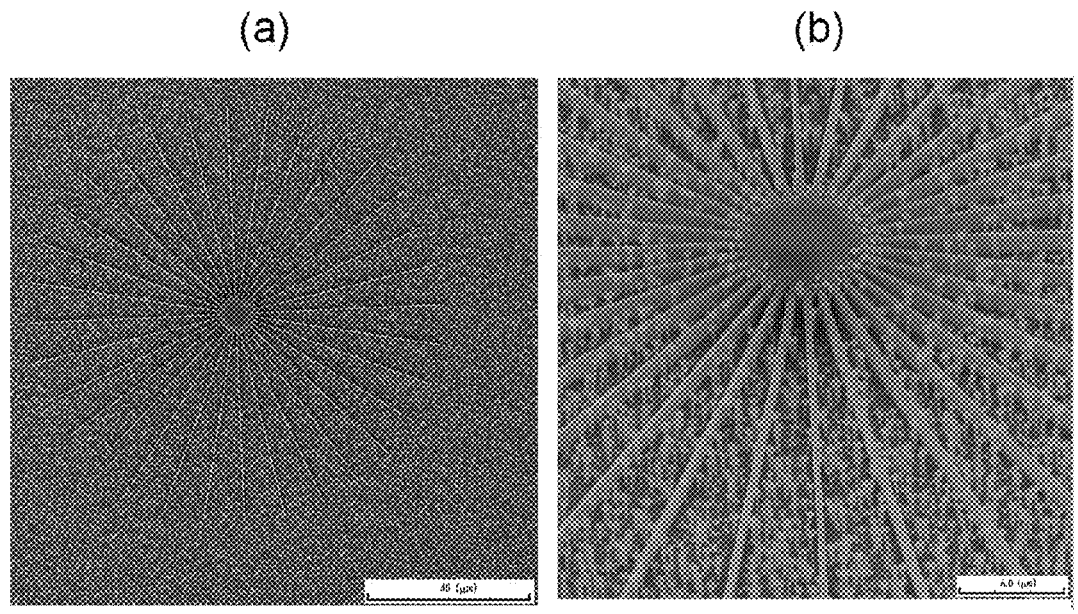
FIG. 7 is a view showing an SEM image of a GaN fine wall-shaped structure that has grown on a GaN thin film crystal substrate having a Ti film formed thereon.

A GaN fine wall-shaped crystal was grown under the same condition as in the Example 1 except that the Ti film pattern was changed to a radial shape. FIG. 7 shows an SEM image of the substrate surface after the GaN fine wall-shaped crystal was grown. The height h of the obtained GaN fine wall-shaped crystal was about 1,000 nm. The width d of the fine wall-shaped crystal in a direction perpendicular to the direction in which the fine wall-shaped crystal extends in an in-plane direction was about 50 nm to about 400 nm. The length was about 50 µm. The ratio (h/d) of these was about 2.5 to about 20. The designed value of the InGaN layer was set to be such that the height a was about 3 nm and the number of layers was 1. The width b of the InGaN layer is the same as the above d. The ratio of the height a and the width b of the InGaN active layer was about 0.0075 to about 0.06. Also, electron microscope observation was carried out on the plurality of fine wall-shaped structures formed on the substrate. It was confirmed that all of them had been formed at an angle of 89 to 91 degrees relative to the substrate surface.

Figure 12:
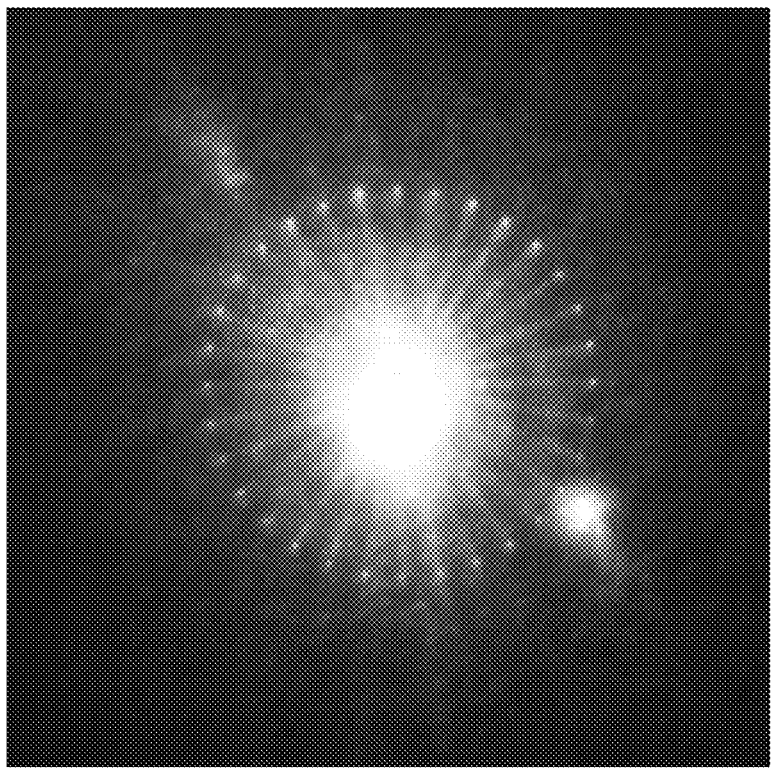
FIG. 12 is a view showing a result of microscopic PL measurement on the GaN fine wall-shaped structure.

Further, the obtained fine wall-shaped crystal was evaluated. FIG. 12 shows a result of performing a microscopic PL (Photo Luminescence) measurement on the obtained GaN fine wall-shaped crystal. The measurement was carried out under the same condition as in the Example 1. In the fine wall-shaped crystal of the present Example, a strong PL light emission was confirmed.

Example 8

Figure 8:
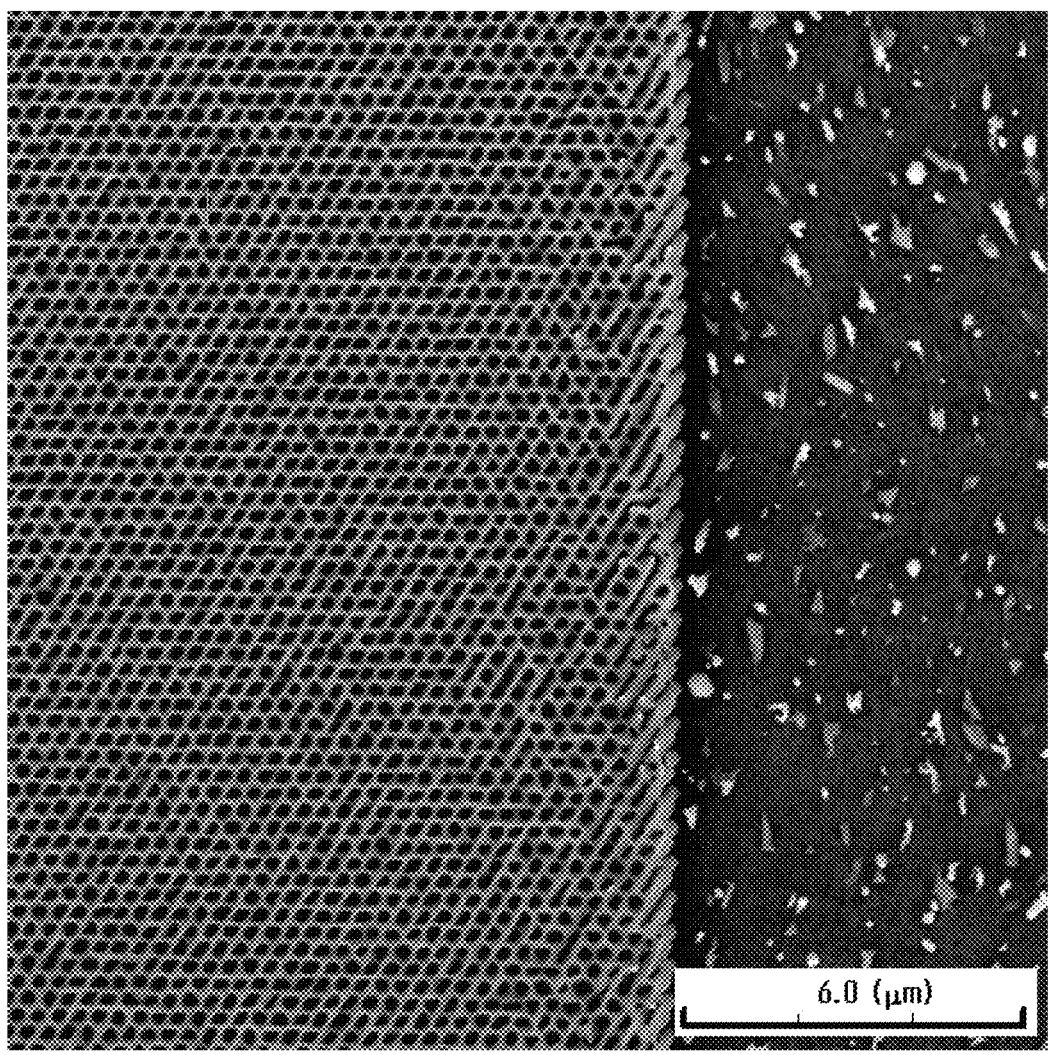
FIG. 8 is a view showing an SEM image of a GaN fine wall-shaped structure that has grown on a GaN thin film crystal substrate having a Ti film formed thereon.

A GaN fine wall-shaped crystal was grown under the same condition as in the Example 1 except that the Ti film pattern was changed to a mesh shape. FIG. 8 shows an SEM image of the substrate surface after the GaN fine wall-shaped crystal was grown. The height h of the obtained GaN fine wall-shaped crystal was about 300 nm. The width d of the fine wall-shaped crystal in a direction perpendicular to the direction in which the fine wall-shaped crystal extends in an in-plane direction was about 150 nm. The ratio (h/d) of these was about 2. Also, the period was about 300 nm. The designed value of the InGaN layer was set to be such that the height a was about 3 nm and the number of layers was 1. The width b of the InGaN layer is the same as the above d. The ratio of the height a and the width b of the InGaN active layer was about 0.02. In the fine wall-shaped crystal of the present Example, a strong PL light emission was confirmed.

Example 9

Figure 9:
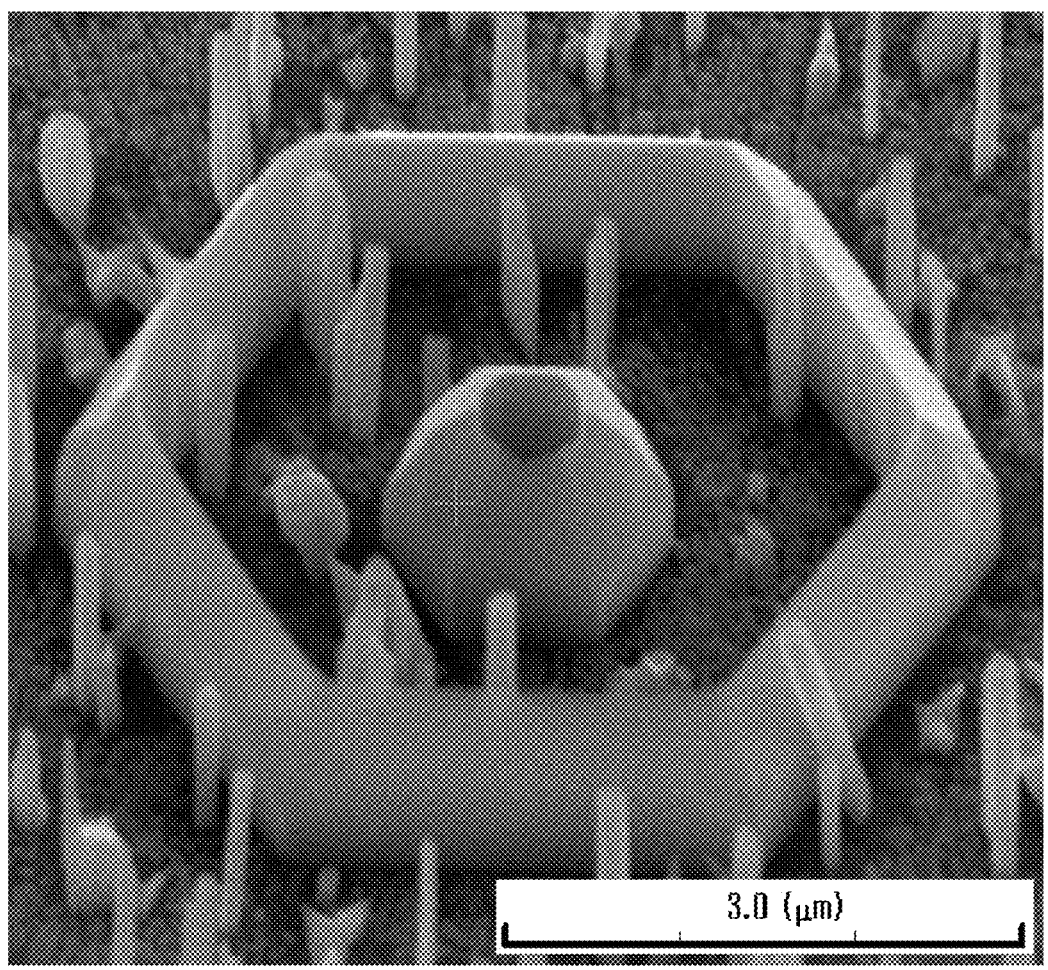
FIG. 9 is a view showing an SEM image of a GaN fine wall-shaped structure that has grown on a GaN thin film crystal substrate having a Ti film formed thereon.

A GaN fine wall-shaped crystal was grown under the same condition as in the Example 1 except that the Ti film pattern was changed to a ring shape. FIG. 9 shows an SEM image of the substrate surface after the GaN fine wall-shaped crystal was grown. The height h of the obtained GaN fine wall-shaped crystal was about 400 nm. The width d of the fine wall-shaped crystal in a direction perpendicular to the direction in which the fine wall-shaped crystal extends in an in-plane direction was about 300 nm. The ratio (h/d) of these was about 1.3. The length of one side of the largest hexagonal ring resonator was about 60 µm. The designed value of the InGaN layer was set to be such that the thickness was about 3 nm and the number of layers was 1. The ratio of the height a and the width b of the InGaN active layer was about 0.009 to about 0.01. Also, electron microscope observation was carried out on the plurality of fine wall-shaped structures formed on the substrate. It was confirmed that all of them had been formed at an angle of 89 to 91 degrees relative to the substrate surface. Further, the top crystal surface of the obtained GaN fine wall-shaped crystal was such that a surface that was oblique relative to the substrate surface appeared. The angle of the top crystal surface relative to the substrate surface was about 45 degrees. In the fine wall-shaped crystal of the present Example, a strong PL light emission was confirmed.

The fine wall-shaped crystal obtained in each of the Examples described above is a single crystal. Also, the fine wall-shaped crystal obtained in each of the Examples had extremely few dislocations. It has been found out that the dislocations are especially few when the width of the fine wall-shaped crystal is 1,000 nm or less, particularly when the width is 600 nm or less.

Here, in each of the Examples, a Ti film is used as a mask. It has been found out that a similar fine wall-shaped crystal can be obtained also when a film of tungsten, molybdenum, or the like is used.

Also, it has been found out that a fine wall-shaped crystal can be obtained in the same manner also when titanium oxide is used as a mask.

The present invention is applicable in the field of electronic devices and optical devices. The fine wall-shaped crystal according to the present invention has excellent light emission characteristics, and application to light-emitting devices can be expected. Also, application to highly integrated field effect transistors and further to a technique of biochips and others can be considered.

The invention claimed is:

1. A group-III nitride structure comprising:
a substrate; and
a plurality of fine wall-shaped structures disposed to stand on said substrate in a vertical direction relative to a surface of said substrate and extending in an in-plane direction of said substrate, wherein
said plurality of fine wall-shaped structures contains a group-III nitride semiconductor crystal,
a height of said plurality of fine wall-shaped structures is h and a width of said plurality of fine wall-shaped structures in a direction perpendicular to the vertical direction and the extending direction is d,
h is larger than d,
d is 600 nm or less,
a mask having a plurality of openings is disposed on the surface of said substrate,
said mask has a thickness of 2 nm or more and 100 nm or less,
each of said plurality of fine wall-shaped structures is disposed at each of said plurality of openings,
a length in the extending direction of said plurality of fine wall-shaped structures is longer than d, and
said plurality of fine wall-shaped structures are radially disposed in a top view.

2. A group-III nitride semiconductor optical element comprising a mask having a surface including titanium (Ti) formed in a predetermined region on a surface of a substrate and a fine wall-shaped structure including a group-III nitride semiconductor formed at least on the surface of said substrate, wherein
said fine wall-shaped structure is disposed to stand in a vertical direction relative to the surface of said substrate and extends in an in-plane direction of said substrate,
wherein a height of said fine wall-shaped structure is h and a width of said fine wall-shaped structure in a direction perpendicular to the vertical direction and the extending direction is d, h is larger than d,
d is 600 nm or less,
said fine wall-shaped structure contains an active layer,
said mask has an opening,
said fine wall-shaped structure is disposed at said opening, and
a length in the extending direction of said fine wall-shaped structure is longer than d.

3. The group-III nitride semiconductor optical element as claimed in claim 2, wherein a ratio (a/b) of a height a of said active layer to a width b of said active layer in a direction perpendicular to the vertical direction and the extending direction is 0.0002 or more and 4 or less.

4. The group-III nitride semiconductor optical element as claimed in claim 2, wherein said active layer is indium gallium nitride (InGaN).

5. The group-III nitride semiconductor optical element as claimed in claim 2, wherein said mask has a thickness of 2 nm or more and 100 nm or less.

* * * * *